United States Patent
Schulz et al.

(10) Patent No.: US 8,811,442 B2
(45) Date of Patent: Aug. 19, 2014

(54) INFRARED SEMICONDUCTOR LASER

(75) Inventors: Nicola Schulz, Turgi (CH); Marcel Rattunde, Gundelfingen (DE); Joachim Wagner, Freiburg (DE); Benno Rösener, Freiburg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 326 days.

(21) Appl. No.: 12/855,767

(22) Filed: Aug. 13, 2010

(65) Prior Publication Data

US 2011/0013658 A1   Jan. 20, 2011

Related U.S. Application Data

(63) Continuation of application No. PCT/EP2009/001066, filed on Feb. 16, 2009.

(30) Foreign Application Priority Data

Feb. 15, 2008   (DE) .................. 10 2008 009 412

(51) Int. Cl.
 *H01S 5/323* (2006.01)
(52) U.S. Cl.
 USPC ..................... 372/45.01; 372/43.01
(58) Field of Classification Search
 USPC ...................................... 372/45.01
 See application file for complete search history.

(56) References Cited

U.S. PATENT DOCUMENTS

| 5,251,225 | A | 10/1993 | Eglash et al. |
|---|---|---|---|
| 5,793,787 | A | 8/1998 | Meyer et al. |
| 6,330,263 | B1 * | 12/2001 | Garbuzov et al. ........ 372/45.011 |
| 2003/0043877 | A1 | 3/2003 | Kaspi |
| 2005/0152415 | A1 | 7/2005 | Giesen et al. |
| 2007/0153856 | A1 | 7/2007 | Kageyama et al. |
| 2007/0274361 | A1 | 11/2007 | Calvez et al. |

OTHER PUBLICATIONS

Schulz et al. "Resonant optical in-well pumping of an (AlGaIn)AsSb)-based VECSEL emitting at 2.35um", Appled Physics Letters, 91.091113 (2007).*
International Search Report and Written Opinion from PCT/EP2009/001066, issued on May 25, 2009.
Devenson et al., "InAs/AlSb quantum cascade lasers emitting below 3um" Applied Physics Letters 90, (2007) American institute of Physics, pp. 111118-111118-3.

(Continued)

*Primary Examiner* — Xinning Niu
(74) *Attorney, Agent, or Firm* — Gesmer Updegrove LLP

(57) ABSTRACT

The present invention relates to a semiconductor laser having at least one quantum film in which electron hole pairs can be recombined, having at least two barrier layers between which respectively one of the at least one quantum films is disposed adjacently to these, directly in a planar manner or via respectively one intermediate film, and also having a pump device, the barrier layers having or consisting of $Al_zGa_{1-z}As_ySb_{1-y}$, with y greater than or equal to zero and less than or equal to one and z less than or equal to one and greater than 0.4, and/or having or consisting of $Al_zGa_uIn_vAs_ySb_{1-y}$, with $z+u+v=1$ and z greater than 0.25, the electron hole pairs being able to be produced directly in the quantum film with the pump device.

18 Claims, 2 Drawing Sheets

(56) References Cited

OTHER PUBLICATIONS

Figure 1A:
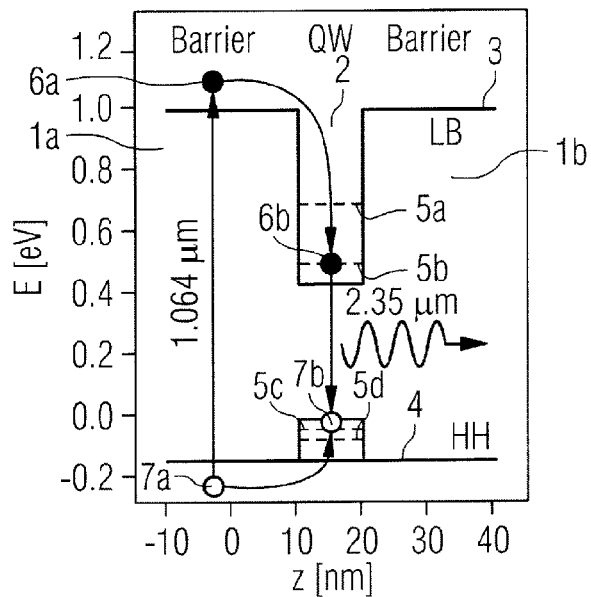

Kaspi et al., "High performance optically pumped antimonide lasers operating in the 2.4-9.3 um wavelength range" Applied Physics Letters 88, 2006 American Institute of Physics, pp. 041122-1-041122-3.

Schulz et al., "Resonant optical in-well pumping of an (AlGaIn)(AsSb)-based vertical-external-cavity surface-emitting laser emitting at 2.35um" Applied Physics Letters 91, 2007 American Institute of Physics, pp. 091113-1-09113-3.

Vaughn et al., "Type I Mid-Infrared MQW Lasers using AlInAsSb barriers and InAsSb wells" XP 002393478, Physics and Simulation of Optoelectronic Devices XIII, SPIE 2005, pp. 307-318.

Gray et al. "High-resolution x-ray and transmission electron microscopic analysis of a GaInAsSb/AlGaAsSb multiple quantum laser structure" Journal of Applied Physics, vol. 85, No. 11, 1999 American Institute of Physics, pp. 7664-7670.

Newell et al., "The Effect of Increased Valence Band Offset on the Operation of 2um GaInAsSb—AlGaAsSb Lasers" IEEE Photonics Technology Letters, vol. 11, No. 1, Jan. 1999, pp. 30-32.

Grau et al., "Room-temperature operation of 3.26um GaSb-based type-I lasers with quinternary AlGaInAsSb barriers" 2005 American Institute of Physics, Applied Physics Letters, 87, pp. 241104-1-241104-3.

Solov'ev et al., "MBE growth and photoluminescence properties of strained InAsSb/AlSbAs quantum wells" 2003 Journal of Crystal Growth 251, pp. 538-542.

International Search Report issued in connection with the PCT/EP2009/001066.

International Preliminary Report on Patentability issued in connection with International Application No. PCT/EP2009/001066 mailed on Sep. 7, 2010.

Rattunde et al., "Temperature sensitivity of high power GaSDb based 2um diode lasers" Inst. Phys. Conf. Ser No. 174, Sec. 5, Oct. 7-10, 2002, pp. 347-350, IOP Publishing Ltd. 2003.

\* cited by examiner

INFRARED SEMICONDUCTOR LASER

PRIORITY INFORMATION

This application is a continuation of PCT Application NO. PCT/EP2009/001066 filed Feb. 16, 2009, that claims priority to German Application No. 102008009412.9, filed on Feb. 15, 2008. Both applications are incorporated hereby in reference in their entireties.

BACKGROUND OF THE INVENTION

The invention relates to a semiconductor laser with a type I laser structure which achieves improved efficiency and greater maximum wavelengths.

A plurality of atmospheric transmission windows and absorption bands of numerous gases and chemical substances are situated in the optical spectral range between 2 and 4 µm (partial range of the intermediate infrared). Furthermore, water has its absolute absorption maximum at a wavelength of 3 µm. Efficient and compact laser sources in this wavelength range are hence of central importance for a large number of applications, both in scientific, medical and commercial and in safety-relevant and military spheres.

Conventional types of laser, such as e.g. thulium-, holmium- or erbium-doped solid or fibre lasers, in fact emit in this wavelength range, however only isolated emission lines or bands of the different laser materials exist here, which do not enable complete coverage of the mentioned spectral range. Hence, with these types of laser, adaptation of the emission wavelength to concrete applications can be effected only in a restricted manner.

However, adaptation can be achieved by using semiconductor lasers based on III/V compound semiconductors. By varying the layer structures and material compositions, in principle emission wavelengths which completely cover the intermediate infrared can be achieved here. Thus, in the intermediate infrared, several types of such semiconductor lasers have existed to date, a differentiation being able to be made here between electrically- and optically-pumped lasers.

Examples of electrically-pumped semiconductor lasers in the intermediate infrared are double heterostructure diode lasers, GaSb-based "type I" lasers with emission wavelengths between 1.8 and 3.3 µm and also quantum cascade lasers (QCL) with $\lambda \geq 3$ µm. Optically-pumped lasers in this spectral range are e.g. lasers with "type II" or "W" laser structure (wavelength $\lambda = 2.4$-$9.3$ µm).

Each of these concepts has advantages and disadvantages specific to the type of construction. By way of example, QCLs emit a strongly divergent output beam and achieve in particular, in the wavelength range relevant for this invention ($\lambda \leq 4$ µm), only low efficiency, output powers and maximum operating temperatures (J. Devenson, R. Teissier, O. Cathabard and A. Baranov, "InAs/AlSb quantum cascade laser emitting below 3 µm", Appl. Phys. Lett. 90, 111118 (2007)). Furthermore, surface-emitting QCLs cannot be produced because of basic physical effects. With InAs/GaSb-based lasers with type II laser structure, somewhat shorter wavelengths are achieved with higher efficiency [R. Kaspi, A. Ongstad, G. Dente, J. Chavez, M. Tilton and D. Gianardi, "High performance optically pumped antimonide lasers operating in the 2.4-9.3 µm wavelength range", Appl. Phys. Lett. 88, p. 041122 (2006)], however, because of a spatially indirect electronic transition between conduction- and valency band, the optical gain required for the laser activity, in comparison with type I lasers with spatially direct transmission, is lower. The two proposed types of laser are dependent for efficient laser operation, in particular for the continuous wave mode, upon (in part cryogenic) cooling, which can greatly restrict the field of application.

In semiconductor lasers with "type I" structure of the active region, laser radiation is produced in that, in the active quantum films or quantum wells (QW) in the valency band (VB) and typically in the heavy hole band (HH band), electron hole pairs are recombined with stimulated emission of a laser photon. The electron hole pairs are produced by pumping in the barrier layers, then migrate into the quantum film and recombine there. In GaSb-based type I lasers with emission wavelength above approx. 1.7 µm, the quantum films with a thickness of a few nanometers generally consist of $Ga_xIn_{1-x}Sb$ or $Ga_xIn_{1-x}As_ySb_{1-y}$, x and y respectively describing the molar proportion of Ga (gallium) or As (arsenic) in the quantum film material. The quantum films are normally embedded in $Al_zGa_{1-z}As_ySb_{1-y}$ barrier layers, z representing the molar proportion of Al (aluminium) in the quaternary barrier material. The arsenic content y of the barrier layers is typically adjusted such that these can be grown lattice-adapted to the GaSb substrate. The lattice adaptation of the barrier layers is however not a compulsory condition for production of a semiconductor laser structure. In general, barrier layers with a molar aluminium proportion z of approx. 30 to 35% are used.

During the laser operation, the temperature in the active region of the lasers can be above the heat sink temperature by some ten degrees. The efficiency of GaSb-based type I lasers is hereby greatly reduced, in particular at wavelengths above approx. 2.4 µm.

Furthermore, in the case of lasers in which a plurality of quantum wells are placed one behind the other, a non-homogeneous occupation of the quantum wells with electrons results, which likewise can impair the efficiency of the laser.

SUMMARY OF THE INVENTION

It is therefore the object of the invention to indicate a semiconductor laser which has improved efficiency at greater wavelengths and in addition enables production of greater wavelengths. The semiconductor laser is thereby intended to be able to be produced without higher production expenditure.

This object is achieved by the semiconductor laser according to claim 1. The respective dependent claims describe advantageous developments of the semiconductor laser according to the invention and of the method according to the invention for production of laser radiation.

The semiconductor laser according to the invention has at least one quantum film in which electron hole pairs can be recombined. The quantum films are disposed adjacently between at least two barrier layers, directly in a planar manner or via respectively one intermediate film. These barrier layers can have or consist of on the one hand, $Al_zGa_{1-z}As_ySb_{1-y}$, with y greater than or equal to zero and less than or equal to one and z less than or equal to one and greater than 0.4. Alternatively, the barrier layers can also have or consist of $Al_zGa_uIn_vAs_ySb_{1-y}$, with $z+u+v=1$ and z greater than 0.25. The first three elements are elements of main group 3, the last two are elements of main group 5.

The semiconductor laser according to the invention has in addition a pump device with which the electron hole pairs can be produced directly in the quantum film. As a result of production of the electron hole pairs directly in the quantum film, the quantum defect no longer depends upon the potential height of the barrier layers so that these can be made sufficiently large in order to prevent thermal leakage currents from holes out of the quantum films into the surrounding barrier layers. In this way, the efficiency of the laser at long wavelengths can be improved and the maximum wavelength increased if the band gap of the quantum film is reduced in size, and the energetic position thereof is displaced at the same time towards lower energies.

It is preferred if the quantum film or films are homogeneous, i.e. are not constructed for their part from a plurality of layers. The quantum film can have or consist of $Ga_iIn_{1-i}Sb$ and/or $Ga_xIn_{1-x}As_kSb_{1-k}$ with i, x and k greater than or equal to zero and less than or equal to one. However, preferred is $0.2 \leq i \leq 0.9$, particularly preferred $0.4 \leq i \leq 0.8$, particularly preferred i=0.8 and/or $0.3 \leq x \leq 0.8$, preferably $0.4 \leq x \leq 0.7$ and/or $0 \leq k \leq 0.5$, preferably $0.1 \leq k \leq 0.3$. For an emission wavelength of the laser of 2.35 µm, for example $Ga_{0.64}In_{0.36}As_{0.31}Sb_{0.69}$ is particularly suitable whilst, for an emission wavelength of 3.26 µm, $Ga_{0.45}In_{0.55}As_{0.31}Sb_{0.69}$ is particularly suitable. In general, it hereby applies that the greater the wavelength, the smaller is the proportion of Ga, whilst the proportion of As is all the greater. In fact, there are also exceptions in the considered wavelength range, however the behaviour is basically monotone.

It is preferred in general that the depth of the potential well in the quantum film in a heavy hole band is so large that, at temperatures as occur during operation of the laser, essentially no or only a very small thermal leakage current out of or into layers adjacent to the quantum film occurs. The depth of this quantum well can be adjusted by choice of material of the barrier layers without thereby producing a greater quantum defect. In this way, the efficiency of the laser can be significantly increased above all in the range of long wavelengths.

In order to achieve the effect according to the invention, the electron hole pairs should be produced directly in the quantum film, whilst no electron hole pairs are produced in the barrier layers. For this purpose, it is advantageous if photons can be produced by the pump device and introduced into the quantum film, the energy of which photons is less than or equal to the band gap energy of the barrier layers, the energy of which is however larger at the same time than the band gap energy of the quantum film. It is therefore advantageous if a pumping can take place with the pump device such that essentially no electron hole pairs are excited in the barrier layers and/or exclusively sub-band gap absorption takes place. As a result, energy losses due to the quantum defect are avoided.

For the material of the barrier layers, z can be equal to one so that the material has no gallium. In this case, the material of the barrier layers is for instance ternary $AlAs_ySb_{1-y}$. In particular relative to quaternary $Al_zGa_{1-z}As_ySb_{1-y}$ with z less than 1, this has the advantage that it can be grown more simply and the composition can be produced more precisely. Both of the mentioned materials can however be used in the present invention for the barrier layers. In the case of the quaternary material, z is preferably greater than or equal to 0.4, preferably greater than or equal to 0.7, particularly preferred greater than or equal to 0.9. In the case of z equal to 1, ternary material is present as described.

The pump device of the laser according to the invention can pump optically and/or electrically so that the electron hole pair in the quantum film can be produced by means of optical and/or electrical pumping.

The semiconductor laser structure according to the invention is suitable in particular for production of longwave radiation. The laser is therefore configured preferably such that, with it, electromagnetic radiation of a wavelength between 1.5 and 5 µm, preferably between 2 and 4.5 µm, preferably between 2.5 and 4 µm, preferably greater than or equal to 3 µm, can be produced.

As described, an intermediate film can be disposed between respectively one quantum film and one or two of the barrier layers adjacent thereto. Said intermediate film can have or consist of the material $Al_zGa_{1-z}As_ySb_{1-y}$ mentioned for the barrier layers, z however being preferably less than in the barrier layer. Also the mentioned GaInAsSb and also AlGaInAsSb can be used for the intermediate films, the band gap energy of the intermediate film preferably being greater than or equal to the band gap energy of the quantum film. The intermediate film can be designed to be arbitrarily thin so that its minimum thickness is an atom layer. The intermediate film can however also be dispensed with completely.

Preferably, the laser structure is disposed on a substrate, the substrate then being able to be in contact with one of the barrier layers or being able to be separated by further structures, such as e.g. a Bragg reflector, from the barrier layer closest to the substrate. The substrate preferably has or consists of GaSb, GaAs and/or InAs, the material of the barrier layers preferably being adjusted such that the barrier layer adjacent to the substrate is grown lattice-adapted to the grating for the substrate or distorted. In a further embodiment variant, the substrate can also be removed again completely after production of the laser structure.

The semiconductor laser according to the invention can have any number of quantum films which are separated from each other by barrier layers and possibly by intermediate layers. Without a possible substrate, barrier layers can then hereby be situated at the extremes of the structure. Due to production of electron hole pairs in the quantum films, the problem of non-homogeneous occupation of the quantum wells with electrons, because of the great depth in the valency band, can be likewise avoided with a corresponding design of the laser structure in which, in each quantum well, approximately the same number of charge carriers is produced by pump absorption.

A method for production of laser radiation with a wavelength greater than or equal to 1.5 µm, preferably greater than or equal to 2 µm, preferably greater than or equal to 2.5 µm, preferably greater than or equal to 3 µm, is also according to the invention, electron hole pairs being produced directly in a quantum film in a semiconductor structure. This quantum film is preferably disposed between barrier layers in which no electron hole pairs are produced during pumping. The method according to the invention can be implemented with the above-described semiconductor laser.

By means of the semiconductor according to the invention, the described problems occurring with previous GaSb-based type I laser structures are completely resolved.

By means of the invention, these lasers can be improved in their efficiency in the wavelength range up to approx. 3 µm which was previously not covered and, in the case of longer wavelengths, can be made possible at all for the first time without thereby basically increasing the production expenditure. In comparison with the laser types according to the state of the art, higher efficiencies and output powers and also a reduced cooling requirement are possible. As a function of the construction of the laser (edge- or surface-emitting, with or without external resonator), laser operation at a low divergence and virtually diffraction-delimited quality of the emitted laser beam is possible, which is of central importance for example for optical free beam applications.

By means of in-well pumping, in comparison with electrically-pumped or optical barrier-pumped lasers, the production of lost heat is reduced.

By means of the simultaneous use of $AlAs_ySb_{1-y}$ or $Al_zGa_{1-z}As_ySb_{1-y}$ barrier layers with an Al proportion z of more than 40%, thermal leakage currents of holes in the surrounding barrier layers are effectively suppressed in comparison with conventional structures.

Furthermore, also further properties which have a positive effect on the laser operation result when using $AlAs_ySb_{1-y}$ or $Al_zGa_{1-z}As_ySb_{1-y}$ barrier layers with an Al proportion z of more than approx. 40%:

with increasing Al content of the barrier layers, the refractive index n of the barrier layers reduces. For example, at a wavelength of 2.3 μm with z=0.3, the refractive index is n=3.6 and with z=1, n=3.1. The quantum film material at this wavelength has a refractive index of approx. 4. If now the barrier layers surrounding the quantum film have a lower refractive index with respect to the quantum film material, the optical intensity of the laser mode in the region of the quantum films is superelevated. The superelevation is all the greater, the lower the refractive index in the barrier layers. Because of the resulting higher overlap of the optical mode with the quantum wells, the modal gain of the quantum wells is increased with a given quantum well charge carrier density. Hence the modal gain required to achieve the laser threshold can be achieved already at a lower charge carrier density than when using barrier layers with a lower Al content and the resulting higher refractive index. Because of the lower charge carrier density in the quantum well, the rate of the Auger recombination processes counteracting the laser operation is reduced since the Auger recombination rate increases with the third power of the charge carrier density.

The thermal conductivity of $Al_zGa_{1-z}As_ySb_{1-y}$ increases for z>50% because of the disorder which becomes reduced in the lattice structure of this material. In particular, the ternary $AlAs_ySb_{1-y}$ has a higher thermal conductivity than quaternary $Al_zGa_{1-z}As_ySb_{1-y}$. Because of this material property, the lost heat produced during the laser operation in the quantum films can be dissipated more efficiently from these into the surrounding barrier layers. For this further reason, the tolerance of a laser of this type should be increased in addition relative to increases in heat sink temperature or pump power in comparison with lasers with a conventional active region.

The non-homogeneous occupation of the quantum wells with electrons because of the great depth in the valency band can likewise be circumvented by the in-well pumping with a corresponding design of the laser structure in which approx. the same number of charge carriers is produced in each quantum well by pump absorption.

The semiconductor laser according to the invention is intended to be explained subsequently with reference to Figures, by way of example.

DETAILED DESCRIPTION OF THE ILLUSTRATED EMBODIMENTS

There are shown

Figure 1B:
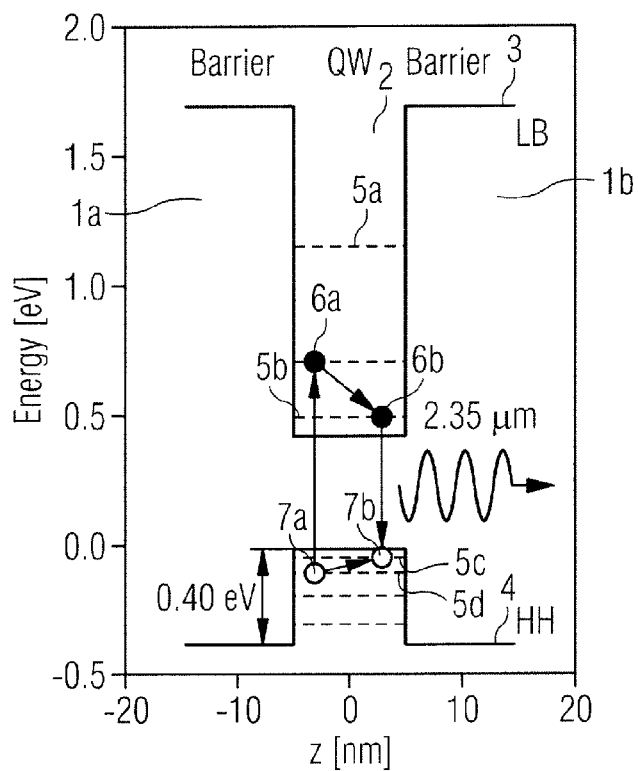
Figure 2A:
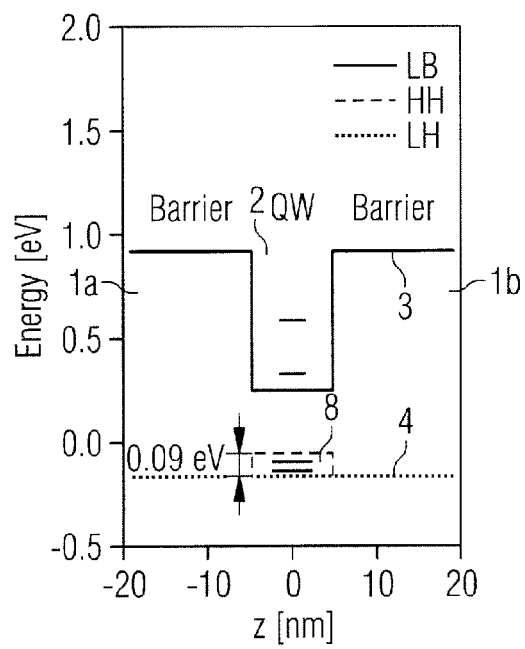
Figure 2B:
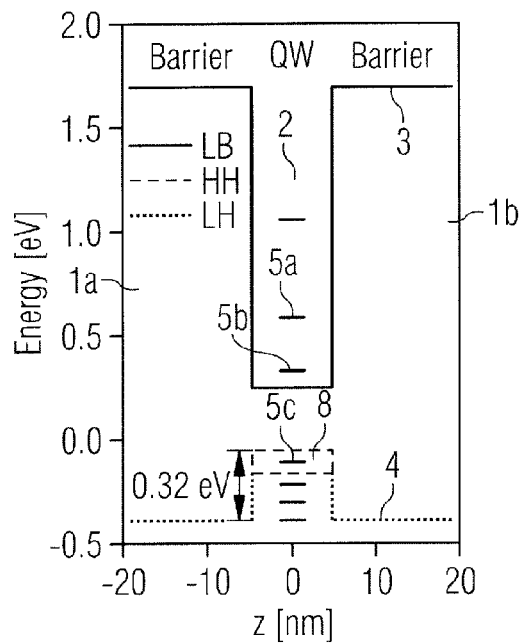

FIG. 1A-1B the principle of the semiconductor laser according to the invention with reference to two band edge diagrams, and FIG. 2A-2B the band edge profiles of a laser with an emission wavelength of 3 μm according to the state of the art and, by comparison, according to the invention.

FIG. 1 shows the band edge profile of a 10 nm wide $Ga_{0.64}In_{0.36}As_{0.10}Sb_{0.90}$ quantum film (emission wavelength: 2.35 μm). In partial FIG. 1(a), the latter is embedded in $Al_{0.30}Ga_{0.70}As_{0.24}Sb_{0.976}$ barrier layers corresponding to the situation in the state of the art. In partial FIG. 1(b), the quantum film is embedded in $Al_{0.90}Ga_{0.10}As_{0.072}Sb_{0.928}$ barrier layers corresponding to the situation in the present invention.

In FIG. 1(a), the laser structure is barrier-pumped. By radiation of electromagnetic radiation with a wavelength of 1.064 μm in the barrier layer 1a, an electron hole pair 6a, 7a is hereby produced. The electron hole pair 6a, 7a then migrates firstly into the quantum film 2 where it is situated as electron hole pair 6b, 7b in the energy levels 5b or 5c of the quantum film 2. This electron hole pair 6b, 7b then recombines with the emission of electromagnetic radiation with a wavelength of 2.35 μm. It is clearly detected that, during migration of the electron hole pair 6a, 7a into the quantum film 2, a large part of the pump energy is converted into heat as a quantum defect. Whilst the potential well in the conduction band 3 has a large depth, the potential well in the heavy hole band 4 is in addition very flat so that thermal leakage currents can flow into the barrier layers 1a and 1b.

As shown in FIG. 1(b), these problems of the state of the art are eliminated according to the invention in that pumping takes place not in the barrier layers 1a or 1b, instead an electron hole pair 6a, 7a is produced directly in the quantum film 2. This electron hole pair 6a, 7a changes with conversion of a small quantity of energy into the states 5b or 5c, where it is then present as an electron hole pair 6b, 7b. From here, it in turn recombines with the emission of electromagnetic radiation with a wavelength of 2.35 μm. It can be clearly detected that the level of the barrier layers 1a, 1b can be changed arbitrarily without the behaviour of the electron hole pair 6a, 7a or 6b, 7b being influenced. In this way, thermal leakage currents in the barrier layers 1a, 1b can be prevented by increasing the barriers 1a, 1b.

FIG. 2 shows band edge profiles of a 10 nm wide $Ga_{0.52}In_{0.48}As_{0.22}Sb_{0.78}$ quantum film (emission wavelength: 3.0 μm), embedded in barrier layers.

FIG. 2(a) hereby shows the situation in the state of the art, whilst FIG. 2(b) shows the situation in the semiconductor laser according to the invention.

In FIG. 2(a), the depth of the quantum well in the heavy hole band 4 is 0.09 eV and is hence too low for efficient operation of the laser. Due to the low depth, a large leakage current is produced in the barrier layers 1a, 1b. The barrier layers here consist of $Al_{0.30}Ga_{0.70}As_{0.024}Sb_{0.976}$.

According to the invention, the band gap energy of the barrier layer can now be changed almost arbitrarily by changing the aluminium and gallium proportion in the material of the barrier layers. This is shown in FIG. 2(b) for barrier layers made of $Al_{0.90}Ga_{0.10}As_{0.072}Sb_{0.928}$. In comparison with FIG. 2(a), the band gap energy of the barrier layers 1a, 1b is approx. twice as large and the depth of the quantum well 8 in the heavy hole band 4 is now 0.32 eV, which is more than three times the value in FIG. 2(a). As a result, thermally activated leakage currents from the heavy hole quantum film 4 are effectively prevented. In the illustrated examples, the laser transition from the lowermost level 5b in the conduction band to the uppermost level 5c in the heavy hole band 4 takes place.

Even at an emission wavelength of 4.0 μm, the HH quantum well 4, when using $Al_{0.90}Ga_{0.10}As_{0.072}Sb_{0.928}$ barrier layers, has a depth of 0.23 eV. Taking into account the epitaxially producible compositions of the quaternary quantum film material and the band gap energies resulting therefrom, the maximum achievable emission wavelength of GaSb-based type I lasers can hence be significantly increased.

Also molar Al proportions of up to 100% in the barrier layers 1a, 1b are possible, as a result of which the hole inclusion in the HH quantum wells 8 can be increased again. One advantage when using 100% aluminium, i.e. $AlAs_ySb_{1-y}$, in the barrier layers 1*a*, 1*b* is that this material is ternary and hence can be grown more easily and the composition can be adjusted more precisely than quaternary $Al_zGa_{1-z}As_ySb_{1-y}$.

What is claimed is:

1. A semiconductor laser having at least one quantum film in which electron hole pairs can be recombined,
   having at least two barrier layers between which respectively one of the at least one quantum films is disposed adjacently to these, directly in a planar manner or via respectively one intermediate film,
   and also having an optical pump device,
   the barrier layers having or consisting of $Al_zGa_{1-z}As_ySb_{1-y}$, with y greater than or equal to zero and less than or equal to one and z less than or equal to one and greater than 0.4, or having or consisting of $Al_zGa_uIn_vAs_ySb_{1-y}$, with z+u+v=1 and z greater than 0.5,
   the electron hole pairs being able to be produced directly in the quantum film with the optical pump device, wherein photons can be introduced into the quantum film by the optical pump device, the energy of which photons is less than or equal to the band gap energy of the barrier layers but greater than the band gap energy of the quantum film.

2. The semiconductor laser according to claim 1, wherein the quantum film is homogeneous or has or consists of $Ga_iIn_{1-i}Sb$ or $GA_xIn_{1-x}As_kSB_{1-k}$ with i, x and k greater than or equal to zero and less than or equal to one.

3. The semiconductor laser according to claim 2, wherein $0.2 \leq i \leq 0.9$, or $0.4 \leq i \leq 0.8$, or $i=0.8$ or $0.3 \leq x \leq 0.8$, or $0.4 \leq x \leq 0.7$ or $0 \leq k \leq 0.5$, or $0.1 \leq k \leq 0.3$ or in that the quantum film has or consists of $Ga_{0.64}In_{0.36}As_{0.1}Sb_{0.9}$ for lasers with an emission wavelength of 2.35 μm or $Ga_{0.45}In_{0.55}As_{0.31}Sb_{0.69}$ for lasers with an emission wavelength of 3.26 μm.

4. The semiconductor laser according claim 1, wherein a potential depth of the quantum film in a heavy hole band is so large that, at temperatures occurring during operation of the laser, essentially no thermal leakage current out of or into layers adjacent to the quantum film occurs.

5. The semiconductor laser according to claim 1, wherein pumping can take place with the optical pump device such that essentially no electron hole pairs are excited in the barrier layers or only sub-band gap absorption takes place.

6. The semiconductor laser according to claim 1, wherein at least a part of the barrier layers comprises or consists of quaternary $Al_zGa_{1-z}As_ySb_{1-y}$ or ternary $AlAs_ySb_{1-y}$.

7. The semiconductor laser according to claim 1, wherein z is greater than or equal to 0.7, or greater than or equal to 0.9, or is equal to 1.

8. The semiconductor laser according to claim 1, wherein two or more quantum films which are separated from each other by barrier layers and are disposed between at least two barrier layers.

9. The semiconductor laser according to claim 1, wherein at least one quantum film has a thickness between 1 nm and 20 nm, or between 5 nm and 15 nm.

10. The semiconductor laser according to claim 1, wherein the barrier layers respectively have a thickness greater than 10 nm, or greater than 100 nm, or of at most 20 μm.

11. The semiconductor laser according to claim 1, wherein the refractive index of the barrier layers at the wavelength of the laser emission is less than the refractive index of the quantum film.

12. The semiconductor laser according to claim 1, wherein the refractive index of the barrier layers at the wavelength of the laser emission is less than or equal to 3.6, or less than or equal to 3.4, or less than or equal to 3.1.

13. The semiconductor laser according to claim 1, wherein that electromagnetic radiation of a wavelength greater than or equal to 1.5 μm, or greater than or equal to 2 μm, or greater than or equal to 2.5 μm, or greater than or equal to 3 μm, can be produced with the laser.

14. The semiconductor laser according to claim 1, wherein that electromagnetic radiation of a wavelength less than or equal to 5 μm, or less than or equal to 4.5 μm, or less than or equal to 4 μm, can be produced with the laser.

15. The semiconductor laser according to claim 1, characterised in that at least one cladding layer is disposed on one side, orientated away from the at least one quantum film and not adjacent to the quantum film, of one or two of the barrier layers.

16. The semiconductor laser according to claim 1, wherein between the at least two barrier layers, the quantum film is disposed adjacently to those via respectively one intermediate film, and wherein the intermediate film comprises or consists of $Al_zGa_{1-z}As_ySb_{1-y}$ with z less than in the barrier layer, GaInAsSb, AlGaInAsSb, the band gap energy of the intermediate film being greater than or equal to the band gap energy of the quantum film.

17. The semiconductor laser according to claim 1, wherein between the at least two barrier layers, the quantum film is disposed adjacently to those via respectively one intermediate film, and wherein the intermediate film has a thickness of at least one atom layer.

18. The semiconductor laser according to claim 1, wherein a substrate on which the barrier layers and the at least one quantum film are accommodated, the substrate comprising or consisting of GaSb, GaAs or InAs, and y being adjusted such that the barrier layer adjacent to the substrate is grown lattice-adapted to the latter or distorted.

* * * * *